(12) United States Patent
Park et al.

(10) Patent No.: US 10,991,770 B2
(45) Date of Patent: Apr. 27, 2021

(54) DISPLAY DEVICE WITH DISPLAY PORTION, LIGHT SENSING PORTION, AND CONNECTION BENDING PORTION

(71) Applicant: SAMSUNG DISPLAY CO., LTD., Yongin-si (KR)

(72) Inventors: Yonghan Park, Hwaseong-si (KR); Sangmin Kim, Suwon-si (KR); Seungho Baek, Cheonan-si (KR); Youngseok Seo, Seoul (KR); Seunghoon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/274,970

(22) Filed: Feb. 13, 2019

(65) Prior Publication Data
US 2019/0252473 A1 Aug. 15, 2019

(30) Foreign Application Priority Data

Feb. 14, 2018 (KR) ........................ 10-2018-0018287

(51) Int. Cl.
*H01L 27/32* (2006.01)
*G09G 3/3233* (2016.01)
*H01L 51/52* (2006.01)
*H01L 51/00* (2006.01)

(52) U.S. Cl.
CPC ....... *H01L 27/3227* (2013.01); *G09G 3/3233* (2013.01); *H01L 27/3234* (2013.01); *H01L 27/3276* (2013.01); *H01L 51/0097* (2013.01); *H01L 51/5253* (2013.01); *H01L 27/3246* (2013.01)

(58) Field of Classification Search
None
See application file for complete search history.

(56) References Cited

U.S. PATENT DOCUMENTS

| | | | |
|---|---|---|---|
| 8,056,603 B2 | 11/2011 | Park et al. | |
| 8,072,150 B2 | 12/2011 | Yoon et al. | |
| 9,466,653 B2 | 10/2016 | De Jong et al. | |
| 2013/0076712 A1* | 3/2013 | Zheng | G01J 1/32 345/207 |
| 2014/0055702 A1* | 2/2014 | Park | G02F 1/136286 349/43 |
| 2015/0070840 A1* | 3/2015 | Rappoport | G06F 1/1633 361/679.56 |

(Continued)

FOREIGN PATENT DOCUMENTS

| | | |
|---|---|---|
| KR | 10-1001969 | 12/2010 |
| KR | 101315375 | 9/2013 |

(Continued)

*Primary Examiner* — Amare Mengistu
*Assistant Examiner* — Sarvesh J Nadkarni
(74) *Attorney, Agent, or Firm* — F. Chau & Associates, LLC (57) ABSTRACT

An exemplary embodiment of the present invention is related to a display device, the display device including: a substrate which includes a display portion, a light sensing portion, and a connection portion located between the display portion and the light sensing portion, in which the connection portion is bent such that the light sensing portion overlaps the display portion by bending of the connection portion.

23 Claims, 8 Drawing Sheets

(56) References Cited

U.S. PATENT DOCUMENTS

| | | | | |
|---|---|---|---|---|
| 2015/0303244 A1* | 10/2015 | de Jong | ............. | H01L 27/3227 |
| | | | | 257/40 |
| 2016/0093685 A1* | 3/2016 | Kwon | ................ | H01L 51/5237 |
| | | | | 257/40 |
| 2017/0200411 A1* | 7/2017 | Song | ................... | G09G 3/3233 |
| 2017/0263873 A1 | 9/2017 | Zhang et al. | | |

FOREIGN PATENT DOCUMENTS

| | | |
|---|---|---|
| KR | 10-2017-0095280 | 8/2017 |
| KR | 10-1795427 | 11/2017 |

* cited by examiner

DISPLAY DEVICE WITH DISPLAY PORTION, LIGHT SENSING PORTION, AND CONNECTION BENDING PORTION

CROSS-REFERENCE TO RELATED APPLICATION

This application claims priority under 35 U.S.C. § 119 to Korean Patent Application No. 10-2018-0018287, filed on Feb. 14, 2018, in the Korean Intellectual Property Office (KIPO), the disclosure of which is incorporated by reference herein in its entirety.

TECHNICAL FIELD

Exemplary embodiments of the present invention relate to a display device including a light sensor.

DISCUSSION OF RELATED ART

A display device may include a light sensor to sense the amount of light in the environment surrounding the display device or to detect fingerprints, or the like.

In a typical display device including a light sensor, the light sensor is disposed along the front surface of the display device away from the active display portion. Thus, additional space is provided at the top, bottom, or side of the active display portion to accommodate the light sensor.

To save space, arranging the light sensor in a display pixel is considered, but this arrangement may cause a coupling phenomenon between the display pixel and the light sensor.

SUMMARY

Exemplary embodiments of the present invention may be directed to a display device capable of substantially preventing a coupling phenomenon between a pixel unit and a sensor unit.

According to an exemplary embodiment of the present invention, a display device includes: a substrate including a display portion, a light sensing portion, and a connection portion located between the display portion and the light sensing portion; a pixel transistor disposed at the display portion; a light sensor transistor disposed at the light sensing portion; and a driving integrated circuit disposed at the connection portion and applying a driving signal to each of the pixel transistor and the light sensor transistor. The connection portion is bent and the light sensing portion overlaps the display portion by bending of the connection portion.

The display portion, the connection portion, and the light sensing portion may be located on one surface of the substrate.

The connection portion may have a width smaller than a width of the display portion and a width of the light sensing portion.

The pixel transistor may include a channel layer including a first material different from a second material which a channel layer of the light sensor transistor includes.

The second material included in the channel layer of the light sensor transistor may be more sensitive to light than the first material included in the channel layer of the pixel transistor.

The light sensor transistor may include a light sensor driving transistor and a light sensor switching transistor, the light sensor switching transistor may include a channel layer including one of an oxide semiconductor and a polycrystalline silicon, and the light sensor driving transistor may include a channel layer including an oxide semiconductor.

The pixel transistor may include a channel layer including a polycrystalline silicon or an oxide semiconductor.

The light sensor transistor may be disposed vertically alternately with the pixel transistor.

The display device may further include an organic light emitting element disposed at the display portion. The organic light emitting element may be connected to the pixel transistor and may include a reflective pixel electrode.

The light sensor transistor may include a light sensor driving transistor and a light sensor switching transistor, and the light sensor driving transistor may not overlap the reflective pixel electrode.

The pixel transistor and the light sensor transistor may have a top gate structure.

According to an exemplary embodiment of the present invention, a display device includes: a substrate including a display portion, a light sensing portion, and a connection portion located between the display portion and the light sensing portion; a pixel transistor disposed at the display portion; a light sensor transistor disposed at the light sensing portion; and a pixel gate driver disposed at the display portion, the pixel gate driver connected to the pixel transistor through a first connection line; and a light sensor gate driver disposed at the light sensing portion, the light sensor gate driver connected to the light sensor transistor through a second connection line. The connection portion is bent and the light sensing portion overlaps the display portion by bending of the connection portion.

The display device may further include a driving integrated circuit disposed at the connection portion. The driving integrated circuit may apply a driving signal to each of the pixel transistor and the light sensor transistor. The pixel gate driver and the light sensor gate driver may be connected to the driving integrated circuit.

The pixel gate driver may include a pixel gate driving transistor, and the light sensor gate driver may include a light sensor gate driving transistor.

The pixel gate driving transistor and the light sensor gate driving transistor may include a channel layer including a polycrystalline silicon or an oxide semiconductor.

The pixel transistor may include a channel layer including a material different from a material included in a channel layer of the light sensor transistor.

The light sensor transistor may include a light sensor driving transistor and a light sensor switching transistor, the light sensor switching transistor may include a channel layer including one of an oxide semiconductor and a polycrystalline silicon, and the light sensor driving transistor may include a channel layer including an oxide semiconductor.

The pixel transistor may include a channel layer including a polycrystalline silicon or an oxide semiconductor.

The light sensor transistor may be disposed vertically alternately with the pixel transistor.

The display device may further include an organic light emitting element disposed at the display portion. The organic light emitting element may be connected to the pixel transistor and may include a reflective pixel electrode. The light sensor transistor may not overlap the pixel electrode.

According to an exemplary embodiment of the present invention, a display device includes: a substrate including a display portion, a light sensing portion, and a connection portion located between the display portion and the light sensing portion; a pixel transistor disposed at the display portion; a light sensor transistor disposed at the light sensing portion; a driving integrated circuit disposed at the connection portion and applying a driving signal to each of the pixel transistor and the light sensor transistor; an organic light emitting element disposed at the display portion, connected to the pixel transistor, and including a pixel electrode; and the substrate being folded outward with respect to a folding line at the connection portion. A first back surface of the substrate at the display portion on one side of the folding line and a second back surface of the substrate at the light sensing portion on other side of the folding line may face each other and may be adjacent to each other. The light sensor transistor does not overlap the pixel electrode in a direction perpendicular to the first and second back surfaces.

A material included in a channel layer of the light sensor transistor is more sensitive to light than a material included in a channel layer of the pixel transistor.

BRIEF DESCRIPTION OF THE DRAWINGS

Exemplary embodiments of the present invention will be more clearly understood from the following detailed description taken in conjunction with the accompanying drawings, in which.

Since the drawings in FIGS. 1-10 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Embodiments will now be described more fully hereinafter with reference to the accompanying drawings. Although the present invention may be modified in various manners and have several embodiments, exemplary embodiments are illustrated in the accompanying drawings and will be mainly described in the specification. However, the scope of the present invention is not limited to the exemplary embodiments and should be construed as including all the changes, equivalents and substitutions included in the spirit and scope of the present invention.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises", "comprising", "includes" and/or "including" when used in this specification, specify the presence of stated features, integers, steps, operations, elements, components and/or groups, but do not preclude the presence or addition of one or more other features, integers, steps, operations, elements, components and/or groups thereof.

It will be understood that, although the terms "first", "second", "third" and the like may be used herein to describe various elements, these elements should not be limited by these terms. These terms are only used to distinguish one element from another element. Thus, "a first element" discussed below could be termed "a second element" or "a third element" and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, or 5% of the stated value.

Unless otherwise defined, all terms used herein (including technical and scientific terms) have the same meaning as commonly understood by those skilled in the art to which the present invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe exemplary embodiments of the present invention and like reference numerals refer to like elements throughout the specification.

Hereinafter, exemplary embodiments of the present invention will be described with reference to the accompanying drawings.

Figure 1:
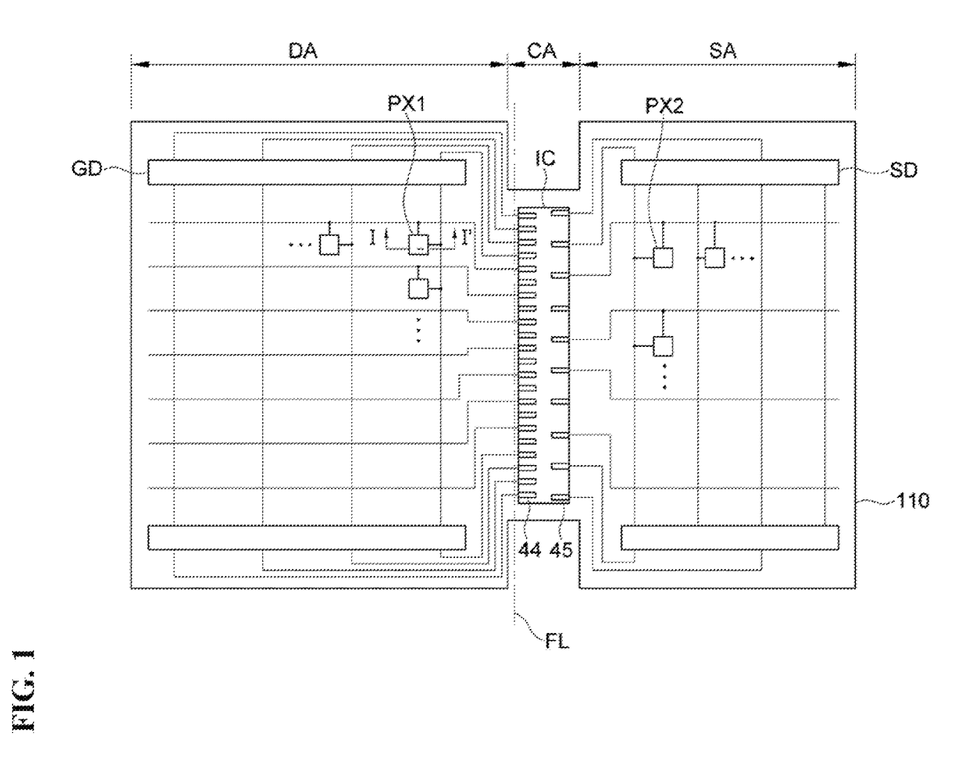
FIG. 1 is a plan view illustrating a display device according to an exemplary embodiment of the present invention in an unfolded state.
Figure 2:
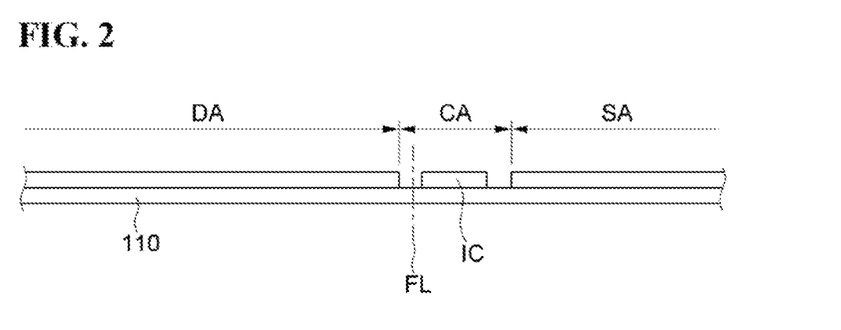
FIG. 2 is a cross-sectional view illustrating a display device according to an exemplary embodiment of the present invention in an unfolded state.
Figure 3:
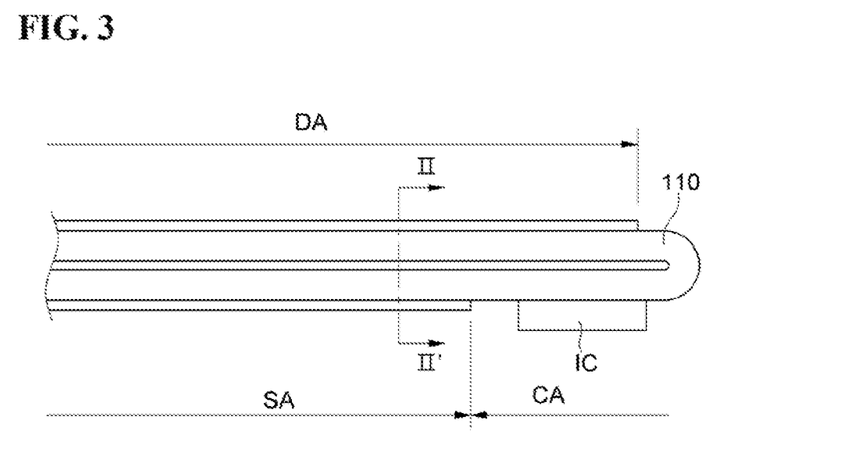
FIG. 3 is a cross-sectional view illustrating a display device according to an exemplary embodiment of the present invention in a folded state.

FIG. 1 is a plan view illustrating a display device according to an exemplary embodiment of the present invention in an unfolded state, FIG. 2 is a cross-sectional view illustrating a display device according to an exemplary embodiment of the present invention in an unfolded state, and FIG. 3 is a cross-sectional view illustrating a display device according to an exemplary embodiment of the present invention in a folded state.

Referring to FIGS. 1 to 3, a display device according to an exemplary embodiment of the present invention includes a substrate 110 and a driving integrated circuit (IC) chip.

The substrate 110 according to an exemplary embodiment of the present invention may be a flexible display panel. Flexible display panel may allow the substrate to be bent. The substrate 110 may include, for example, an organic polymer (e.g., a plastic material), a metal, a metal oxide or a metal nitride.

The substrate 110 includes a display portion DA, a connection portion CA extending from the display portion DA, and a light sensing portion SA extending from the connection portion CA.

The connection portion CA may be folded with respect to a folding line FL.

The display portion DA, the connection portion CA, and the light sensing portion SA are areas divided for ease of descriptions, and are actually located on one surface of the substrate 110.

For ease of descriptions, a surface of the substrate 110 on which images are displayed is referred to as one surface of the substrate 110, and a surface opposite to the one surface is referred to as a back surface of the substrate 110. In addition, a length in a direction in which the display portion DA, the connection portion CA, and the light sensing portion SA are arranged is referred to as a length, and a length in a direction perpendicular to the arrangement direction thereof is referred to as a width.

In an exemplary embodiment of the present invention, the connection portion CA may have a width smaller than a width of the display portion DA and a width of the light sensing portion SA. In addition, a length of the light sensing portion SA may be smaller than a length of the display portion DA. However, the present invention is not limited thereto.

The connection portion CA is folded outward with respect to the folding line FL on the basis of the area where images are displayed.

When the connection portion CA is folded, the light sensing portion SA overlaps at least part of the display portion DA, as shown in FIG. 3. For example, after the connection portion CA is folded with respect to the folding line FL, a first back surface of the substrate 110 of the display portion DA on one side of the folding line FL and a second back surface of the substrate 110 of the light sensing portion SA on the other side of the folding line FL may be adjacent to each other and may face each other. As a result, the first and second back surfaces of the substrate 110 may be interposed between a first one surface of the substrate 110 of the display portion DA on one side of the folding line FL and a second one surface of the substrate 110 of the light sensing portion SA on the other side of the folding line FL. Accordingly, the light sensing portion SA overlaps the display portion DA in a direction perpendicular to the first and second back surfaces of the substrate 110.

The area of the light sensing portion SA may be different from the area of the display portion DA. For example, the area of the light sensing portion SA may be smaller that the area of the display portion DA, but the present invention is not limited thereto.

At the display portion DA of the substrate 110, a pixel transistor, an organic light emitting diode (OLED), a pixel gate driver GD, and various connection lines are disposed.

The connection lines include a plurality of gate lines and a plurality of data lines, each of the plurality of gate lines is connected to the pixel gate driver GD, and each of the plurality of data lines extends to the connection portion CA to be connected to the driving IC.

The pixel gate driver GD sequentially applies gate signals to the gate lines.

The gate lines and the data lines cross each other.

Each pixel is disposed at each of the intersection areas between the gate lines and the data lines, and each pixel includes a pixel circuit.

The pixel circuit for driving the pixel includes a plurality of pixel transistors and a plurality of OLEDs.

The driving of the pixel circuit will be described below.

A light sensor transistor, a light sensor gate driver SD, and various connection lines are disposed at the light sensing portion SA.

The connection lines include a sensing driving line and a lead-out line.

The sensing driving line is connected to the light sensor gate driver SD, and the lead-out line extends to the connection portion CA and is connected to the driving IC.

The connection portion CA includes the driving IC and further includes a pad terminal 44 connected to end portions of various wirings for connecting the pixel gate driver GD and the pixel transistor, and a pad terminal 45 connected to end portions of various wirings for connecting the light sensor gate driver SD and the light sensor transistor.

The driving IC is connected to the pad terminal 44 to apply a control signal, for displaying images, to the pixel gate driver GD and the pixel transistor, and is connected to the pad terminal 45 to apply a control signal, for sensing light, to the light sensor gate driver SD and the light sensor transistor. That is, the driving IC is disposed at the connection portion CA and applying a driving signal to each of the pixel transistor and the light sensor transistor. In addition, the driving IC receives a photocurrent output from the light sensor transistor.

Figure 4:
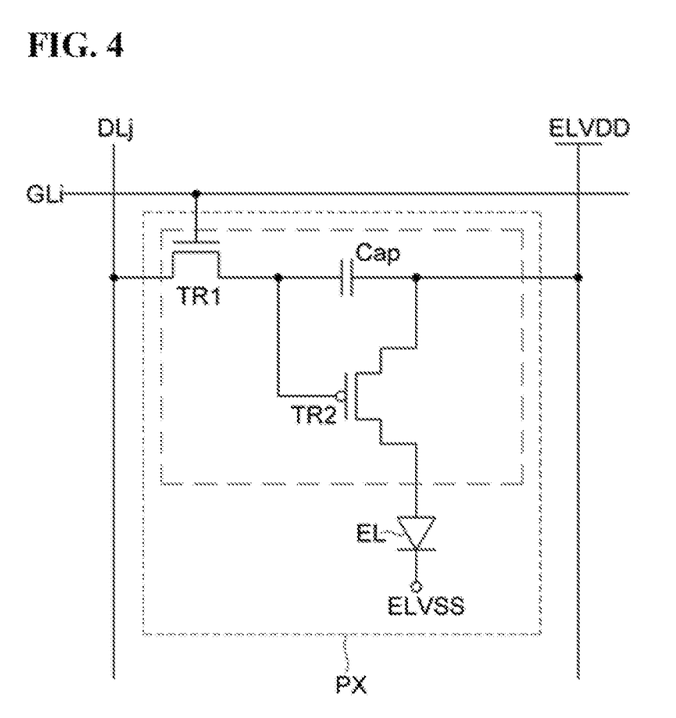
FIG. 4 is a driving circuit diagram illustrating a pixel of a display portion according to an exemplary embodiment of the present invention.

FIG. 4 is a driving circuit diagram illustrating a pixel of a display portion according to an exemplary embodiment of the present invention. In specific, FIG. 4 is an equivalent circuit diagram illustrating a pixel PX formed at one of the intersection points where the gate lines and the data lines shown in FIG. 1 cross each other.

Referring to FIG. 4, the pixel PX includes a first transistor TR1, a second transistor TR2, a capacitor Cap, and an organic light emitting element EL. The organic light emitting element may be an OLED. In an exemplary embodiment of the present invention, an active mode organic light emitting diode (AMOLED) display device having a 2Tr-1Cap structure which includes two transistors and one capacitor in one pixel PX is illustrated. However, the present invention is not limited thereto. For example, the display device may include three or more transistors and two or more capacitors in one pixel, and may have various structures including additional wirings.

The first transistor TR1 may include a control electrode connected to a gate line GLi, an input electrode connected to a data line DLj, and an output electrode. The first transistor TR1 may output a data signal flowing through the data line DLj to the driving IC in response to the gate signal applied to the gate line GLi from the pixel gate driver GD. Here, the first transistor TR1 may be a three terminal device having a gate electrode as the control electrode to turn on and off the first transistor TR1, a source electrode as the input electrode, and a drain electrode as the output electrode.

The capacitor Cap may include a first capacitor electrode connected to the first transistor TR1, and a second capacitor electrode receiving a first power voltage ELVDD. The capacitor Cap may charge an amount of charge corresponding to a difference between the first power voltage ELVDD and a voltage corresponding to the data signal received from the first transistor TR1. The voltage corresponding to the data signal received from the first transistor TR1 may be reduced by a threshold voltage of the first transistor TR1 from a data signal supplied through the data line DLj.

The second transistor TR2 may include a control electrode connected to the output electrode of the first transistor TR1 and the first capacitor electrode of the capacitor Cap, an input electrode for receiving the first power voltage ELVDD, and an output electrode. The output electrode of the second transistor TR2 may be electrically connected to the organic light emitting element EL.

The second transistor TR2 may control the driving current flowing through the organic light emitting element EL in accordance with the amount of charge stored in the capacitor Cap. The turn-on time of the second transistor TR2 may be determined according to the amount of charge charged in the capacitor Cap. The driving current may be determined by a voltage difference between a voltage of the control electrode of the second transistor TR2 and the first power voltage ELVDD. Thus, the output electrode of the second transistor TR2 may apply a voltage with a level substantially lower than that of the first power voltage ELVDD to the organic light emitting element EL.

The organic light emitting element EL is connected to the second transistor TR2 and receives a second power voltage ELVSS. For example, the opposite electrode of the organic light emitting element EL may be connected to the second power voltage ELVSS. The organic light emitting element EL may emit light during the turn-on period of the second transistor TR2.

The first transistor TR1 is a pixel switching transistor, and the second transistor TR2 is a pixel driving transistor. That is, the pixel transistor D_Tr includes the pixel switching transistor and the pixel driving transistor.

Figure 5:
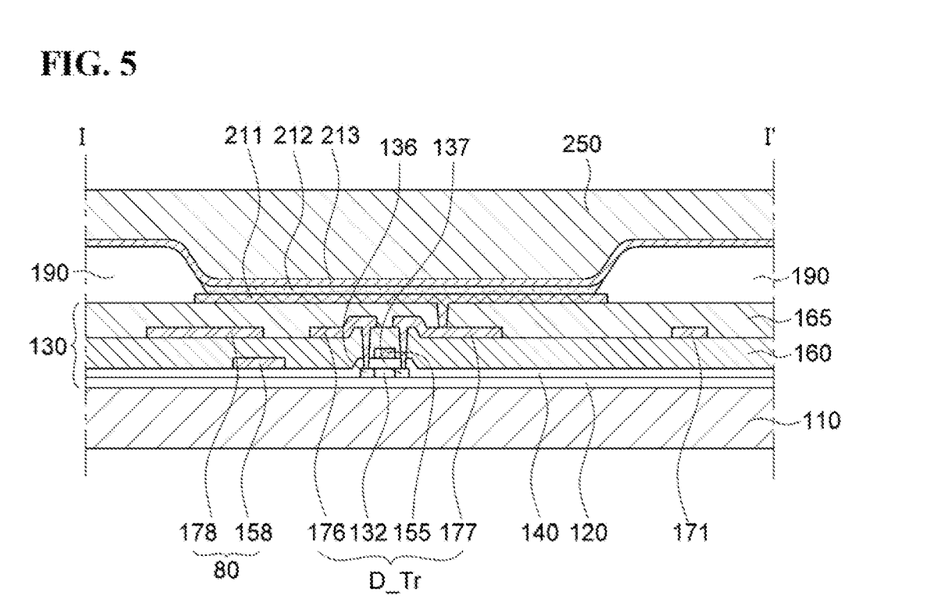
FIG. 5 is a cross-sectional view taken along line I-I' of FIG. 1.

FIG. 5 is a cross-sectional view taken along line I-I' of FIG. 1. For example, FIG. 5 is a cross-sectional view taken along line I-I' at a pixel PX1.

Referring to FIG. 5, the pixel transistor D_Tr is formed on the substrate 110. The substrate 110 may include a flexible material. The flexible material may include plastic materials. For example, the substrate 110 may include but is not limited to one of: kapton, polyethersulphone (PES), polycarbonate (PC), polyimide (PI), polyethylene terephthalate (PET), polyethylene naphthalate (PEN), polyacrylate (PAR), fiber reinforced plastic (FRP), and the like.

The buffer layer 120 is disposed on the substrate 110. The buffer layer 120 serves to substantially prevent permeation of undesirable elements and to planarize a surface therebelow, and may include suitable materials for planarizing and/or preventing permeation of impurities. For example, the buffer layer 120 may include but is not limited to one of the followings: a silicon nitride ($SiN_x$) layer, a silicon oxide ($SiO_2$) layer and a silicon oxynitride ($SiO_xN$) layer. However, the buffer layer 120 is not invariably necessary and may be omitted based on the kinds of the substrate 110 and process conditions thereof.

A driving semiconductor layer 132 is disposed on the buffer layer 120. The buffer layer 120 may prevent penetration of oxygen, moisture, etc. to the driving semiconductor layer 132 located over the substrate 110. The driving semiconductor layer 132 may include one of a polycrystalline silicon and an oxide semiconductor. The oxide semiconductor material, which is a metal oxide semiconductor, may include an oxide based on a metal such as, for example, zinc (Zn), indium (In), gallium (Ga), tin (Sn), or titanium (Ti), or a combination of the metals such as, for example, zinc (Zn), indium (In), gallium (Ga), tin (Sn), and titanium (Ti). For example, the oxide semiconductor may include but is not limited to at least one of: zinc oxide (ZnO), zinc-tin oxide (ZTO), zinc-indium oxide (ZIO), indium oxide ($In_2O_3$), titanium oxide ($TiO_2$), indium-gallium-zinc oxide (IGZO), and indium-zinc-tin oxide (IZTO). For the oxide semiconductor including two or more metals, there is no limitation on the metal composition ratio of these metals. For example, IGZO, may mean an oxide semiconductor containing indium (In), gallium (Ga), and zinc (Zn), and there is no limitation on the composition ratio thereof.

A gate insulating layer 140 is disposed on the driving semiconductor layer 132, and may include but is not limited to at least one of: tetraethylorthosilicate (TEOS), silicon nitride ($SiN_x$) and silicon oxide ($SiO_2$).

A gate wiring which includes a gate electrode 155 is disposed on the gate insulating layer 140. The gate wiring further includes a gate line, a first capacitor plate 158, and other lines. In addition, the gate electrode 155 is disposed so as to overlap at least a portion of the semiconductor layer 132, for example, a channel area thereof.

The gate electrode 155 and the first capacitor plate 158 are disposed on a substantially same layer, for example, the gate insulating layer 140, and include a substantially same metal material. For example, the gate electrode 155 and the first capacitor plate 158 may include at least one of, for example, molybdenum (Mo), chromium (Cr), and tungsten (W). However, the present invention is not limited thereto. For example, the material for the gate electrode 155 and the first capacitor plate 158 may include at least one of, for example, aluminum (Al), copper (Cu), titanium (Ti), platinum (Pt), palladium (Pd), silver (Ag), magnesium (Mg), gold (Au), nickel (Ni), neodymium (Nd), iridium (Ir), lithium (Li), calcium (Ca), and the like.

An insulating interlayer 160 which covers the gate electrode 155 is disposed on the gate insulating layer 140. The insulating interlayer 160, similar to the gate insulating layer 140, may include, for example, tetraethylorthosilicate (TEOS), silicon nitride ($SiN_x$), silicon oxide ($SiO_2$), or the like, but the present invention is not limited thereto. For example, the insulating interlayer 160 may include, for example, silicon oxynitride ($SiO_xN_y$) aluminum oxide ($Al_2O_3$), titanium oxide ($TiO_2$), tantalum oxide ($Ta_2O_5$), hafnium oxide ($HfO_2$), or zirconium oxide ($ZrO_2$).

A data wiring which includes a source electrode 176 and a drain electrode 177 is disposed on the insulating interlayer 160. The data wiring further includes a data line 171, a common power line, a second capacitor plate 178, and other lines. In addition, the source electrode 176 and the drain electrode 177 are connected to a source area 136 and a drain area 137 of the semiconductor layer 132, respectively, through a contact hole defined in the gate insulating layer 140 and the insulating interlayer 160. Here, the semiconductor layer 132 may include the channel area, the source area 136 and the drain area 137. A channel layer of the pixel transistor D_Tr is part of the semiconductor layer 132.

Although the above-described transistor is described as a driving transistor of a pixel, the switching transistor and the gate driving transistor may all have the same structure. However, the structure of such a thin film transistor is not limited to the above-described example, and may be variously modified to a known structure that may be easily practiced by those skilled in the art.

A capacitor 80 includes the first capacitor plate 158 and the second capacitor plate 178 with the insulating interlayer 160 interposed therebetween.

The driving transistor applies, to a pixel electrode 211, a driving power which allows a light emitting layer 212 of an OLED in a selected pixel to emit light. The driving gate electrode 155 is connected to the first capacitor plate 158. Each of the driving source electrode 176 and the second capacitor plate 178 is connected to the common power line. The driving drain electrode 177 is connected to the pixel electrode 211 of the OLED through a contact hole defined in a planarization layer 165 to be described.

The planarization layer 165 is disposed to cover the data wiring, e.g., the data line 171, the common power line, the source electrode 176, the drain electrodes 177, and the second capacitor plate 178, which are patterned into a substantially same layer on the insulating interlayer 160. The planarization layer 165 may be an organic insulating layer, may include an organic material such as an organic polymer, and may be formed by spin coating.

The planarization layer 165 serves to eliminate the step difference and planarize a surface therebelow to enhance the luminous efficiency of the OLED to be formed thereon.

The pixel electrode 211 of the OLED is disposed on the planarization layer 165. The pixel electrode 211 is connected to the drain electrode 177 through a contact hole defined in the planarization layer 165, and thus electrically connected to the drain electrode 177 and the drain area 137 of the semiconductor layer 132.

A pixel defining layer 190 which exposes at least a portion of the pixel electrode 211 to define a pixel area is disposed on the planarization layer 165. The pixel electrode 211 is disposed corresponding to the pixel area of the pixel defining layer 190. For example, the pixel defining layer 190 may define a pixel area of the OLED, may include an organic insulating material such as an organic polymer, and may be formed by spin coating.

The light emitting layer 212 is disposed on the pixel electrode 211 in the pixel area, and a common electrode 213 is disposed on the pixel defining layer 190 and the light emitting layer 212. The light emitting layer 212 includes a low molecular weight organic material or a high molecular weight organic material. The high molecular weight organic material may be a polymer. At least one of a hole injection layer (HIL) and a hole transport layer (HTL) may further be disposed between the pixel electrode 211 and the light emitting layer 212, and at least one of an electron transport layer (ETL) and an electron injection layer (EIL) may further be disposed between the light emitting layer 212 and the common electrode 213. In an exemplary embodiment of the present invention, the light emitting layer 212 of the OLED may include a low molecular weight organic material, and the OLED may include HIL, HTL, the light emitting layer 212, ETL and EIL stacked between the pixel electrode 211 and the common electrode 213.

The pixel electrode 211 and the common electrode 213 may be formed as one of a transmissive electrode, a transflective electrode and a reflective electrode.

Transparent conductive oxide (TCO) may be used to form a transmissive electrode. Examples of the TCO may include but are not limited to: indium tin oxide (ITO), indium zinc oxide (IZO), zinc oxide (ZnO), indium oxide ($In_2O_3$), etc.

In an exemplary embodiment of the present invention, a metal such as, e.g., magnesium (Mg), silver (Ag), gold (Au), calcium (Ca), lithium (Li), chromium (Cr), aluminum (Al), or copper (Cu), or an alloy thereof may be used to form a transflective electrode and a reflective electrode. In such an exemplary embodiment, whether an electrode is a transflective type or a reflective type depends on the thickness of the electrode. Typically, the transflective electrode has a thickness of about 200 nm or less, and the reflective electrode has a thickness of about 300 nm or more. As the thickness of the transflective electrode decreases, light transmittance and resistance increase. On the contrary, as the thickness of the transflective electrode increases, light transmittance decreases.

The transflective electrode and the reflective electrode may have a multi-layered structure which includes a metal layer including a metal or a metal alloy and a TCO layer stacked on the metal layer.

In an exemplary embodiment of the present invention, the organic light emitting element EL (e.g., OLED) may be disposed at the display portion DA and connected to the pixel transistor, in which the organic light emitting element EL may include a reflective pixel electrode 211.

In an exemplary embodiment of the present invention, an encapsulation layer 250 is disposed on the common electrode 213, and may include one or more inorganic layers and one or more organic layers. In addition, the encapsulation layer 250 has a structure in which the inorganic layers and the organic layers are laminated alternately with each other. In such an exemplary embodiment, an inorganic layer is disposed at a lowermost portion.

For the encapsulation layer 250 including one or more inorganic layers and one or more organic layers, the inorganic layers which include a high density thin film may substantially prevent or efficiently reduce permeation of, for example, moisture or oxygen. The organic layers of the encapsulation layer 250 may alleviate the internal stress of the inorganic layers or fills microcracks and pinholes of the inorganic layers, thereby enhancing effects of preventing the permeation of moisture or oxygen.

Figure 6:
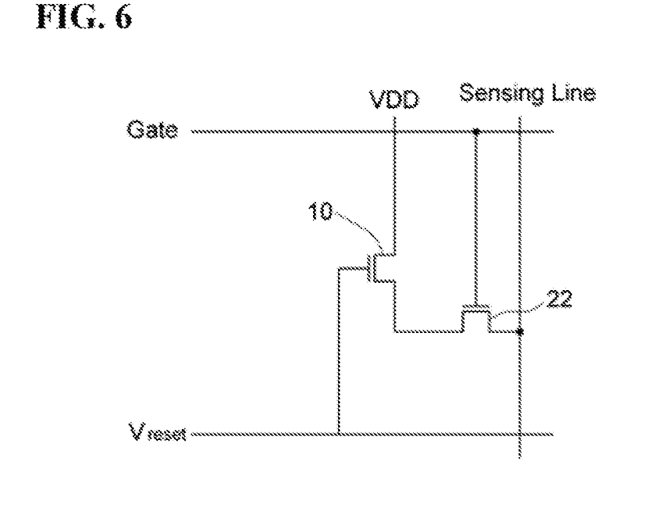
FIG. 6 is a pixel driving circuit diagram illustrating a light sensing portion according to an exemplary embodiment of the present invention.

FIG. 6 is a pixel driving circuit diagram illustrating a light sensing portion according to an exemplary embodiment of the present invention.

A light sensing pixel PX2 includes a light sensor transistor. The light sensor transistor may include a light sensor driving transistor 10 for sensing incident light, and a light sensor switching transistor 22 for outputting a light sensing signal from the light sensor driving transistor 10. A gate of the light sensor switching transistor 22 is connected to a gate line Gate. In addition, the light sensor driving transistor 10 may be an oxide semiconductor transistor having the structure shown in FIG. 7. On the other hand, the light sensor switching transistor 22 may include a channel layer including one of an oxide semiconductor and a polycrystalline silicon. The light sensor driving transistor 10 may be connected in series with the light sensor switching transistor 22. That is, a drain of the light sensor switching transistor 22 may be connected to a source of the light sensor driving transistor 10. In addition, a source of the light sensor switching transistor 22 may be connected to a light sensing line, a drain of the light sensor driving transistor 10 may be connected to a driving voltage line VDD, and a gate of light sensor driving transistor 10 may be connected to a reset line.

With the structure described above, when a gate voltage is applied to the light sensor switching transistor 22 through a gate line Gate, the light sensor switching transistor 22 is turned on into an ON state. Then, in the light sensing pixel, current flows from the source of the light sensor driving transistor 10 to the light sensing line. In such an exemplary embodiment, the amount of current flowing from the light sensor driving transistor 10 to the light sensing line varies according to the intensity of light incident to the light sensor driving transistor 10. Accordingly, when the driving IC measures the amount of current flowing through the light sensing line, the intensity of light incident to the light sensor driving transistor 10 may be calculated. A voltage lower than the threshold voltage is applied to the gate of the light sensor driving transistor 10, while the light sensor switching transistor 22 is in the ON state to output the light sensing signal. On the other hand, while the gate voltage is not applied to the light sensor switching transistor 22 by the light sensor gate driver, the light sensor switching transistor 22 is turned off in an OFF state, so that no current flows through the light sensing line. Accordingly, the light sensing signal may be output through the control of the light sensor switching transistor 22, and whether light is incident to the light sensor driving transistor 10 and the intensity of light may be determined based on the level of the light sensing signal. After light is measured once by the light sensor driving transistor 10, a positive gate voltage may be applied to the gate of the light sensor driving transistor 10 through the reset line for the next measurement. Only two transistors, the light sensor driving transistor 10 and the light sensor switching transistor 22, for the light sensing portion in the light sensor pixel PX2 circuit are shown in FIG. 6, but the presentation invention is not limited thereto. For example, the light sensing portion of the light sensor pixel PX2 circuit may include one or more capacitors, and/or more than two transistors.

Figure 7:
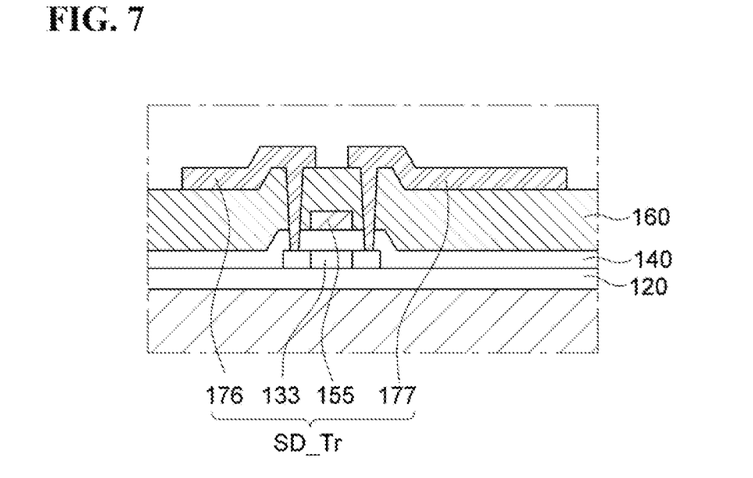
FIG. 7 is a cross-sectional view schematically illustrating a structure of a driving transistor of a light sensing portion according to an exemplary embodiment of the present invention.

FIG. 7 is a cross-sectional view schematically illustrating a structure of a driving transistor of a light sensing portion according to an exemplary embodiment of the present invention.

Referring to FIG. 7, the light sensor transistor has a structure substantially the same as that of the pixel transistor of FIG. 5. Since the pixel transistor and the light sensor transistor are manufactured on one surface of the same substrate, it is effective to form transistors having the same structure.

When the pixel transistor has a top gate structure, illustrated in FIG. 5, in which the gate is formed on the semiconductor layer, the light sensor transistor may be easily manufactured by adopting a top gate structure as well.

The light sensor transistor adopting the top gate structure has a structure in which the gate is disposed below a driving semiconductor layer 133 by bending the connection portion. Such a structure will be described below.

In the structure of the light sensor transistor, a buffer layer 120 is disposed on a substrate 110. In addition, the driving semiconductor layer 133 is disposed on the buffer layer 120.

The driving semiconductor layer 133 of the light sensor transistor includes an oxide semiconductor.

Since oxide semiconductors have light-sensitive characteristics, when oxide semiconductors are employed in the channel layer, for example, in the driving semiconductor layer 133, the threshold voltage and the drain current of the semiconductor transistor, for example, the light sensor transistor, may vary depending on the wavelength or amount of incident light.

A gate insulating layer 140 is disposed on the driving semiconductor layer 133.

A data wiring including a source electrode 176 and a drain electrode 177 is disposed on an insulating interlayer 160.

A planarization layer 165 and an encapsulation layer 250 may be sequentially stacked on the insulating interlayer 160. The substrate 110, the buffer layer 120, the gate insulating layer 140, the source electrode 176, the drain electrode 177, and the encapsulation layer 250, except for the semiconductor layer, are substantially the same as those described above, with the same reference numerals, and thus detailed descriptions thereof will be omitted. That is, except for the semiconductor layer, each of these numerals in FIG. 7 has been described above and may be referred back to the descriptions of each of the same numerals in FIG. 5.

Figure 8:
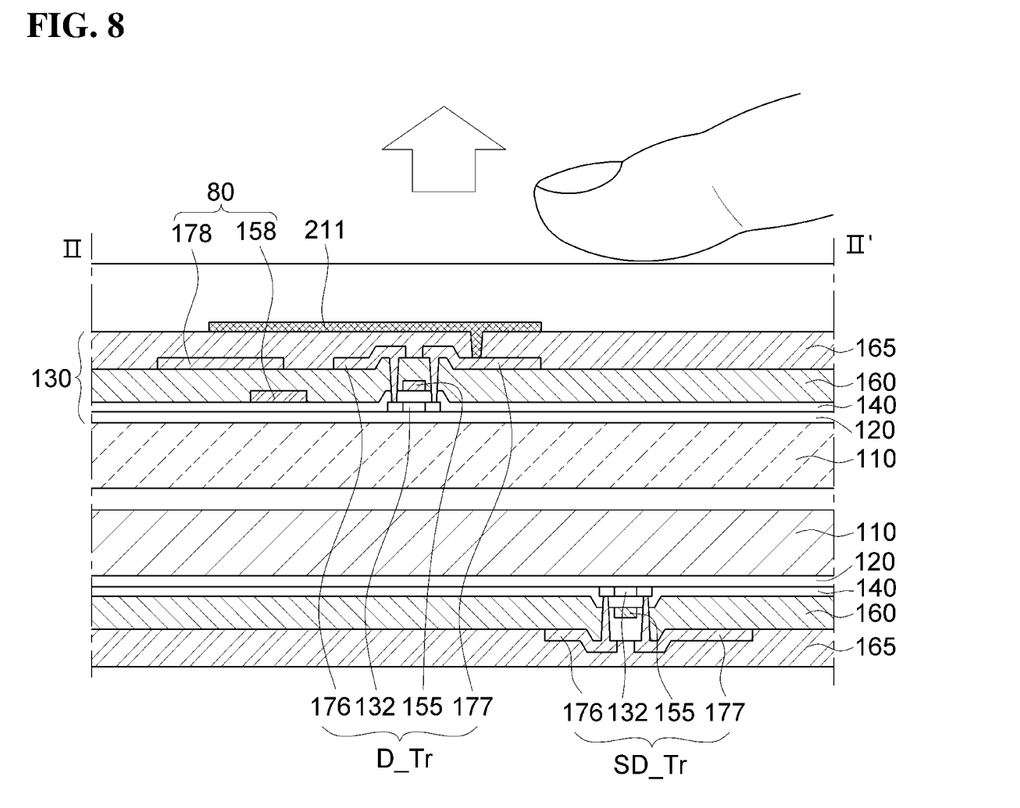
FIG. 8 is a cross-sectional view taken along line II-II' of FIG. 3.

FIG. 8 is a cross-sectional view taken along line II-II' of FIG. 3.

The connection portion CA of the substrate 110 (see FIG. 3) is bent so that the light sensing portion SA overlaps the display portion DA.

The display device has a stack structure such that a back surface of the substrate 110 of the light sensing portion SA and a back surface of the substrate 110 of the display portion DA face each other and are adjacent to each other by bending of the connection portion CA.

The light sensor driving transistor SD_Tr should be located vertically alternately with the reflective pixel electrode 211 of the OLED disposed at the display portion DA. In addition, the light sensor driving transistor SD_Tr does not vertically overlap the pixel electrode 211. Accordingly, the light sensor transistor is disposed vertically alternately with the pixel transistor. Here, a vertical direction is a direction perpendicular to the back surface of the substrate 110 of the light sensing portion SA and the back surface of the substrate 110 of the display portion DA.

In an exemplary embodiment of the present invention, it has been described that the light sensor driving transistor SD_Tr and the pixel driving transistor D_Tr can be formed on a same substrate substantially simultaneously with a substantially same structure. The pixel gate driving transistor and the light sensor driving transistor SD_Tr formed on a same substrate may be formed substantially simultaneously with a substantially same structure.

In addition, the pixel gate driving transistor and the light sensor gate driving transistor may include one of a polycrystalline silicon and an oxide semiconductor such as indium-gallium-zinc oxide (IGZO) or indium-zinc-tin oxide (IZTO).

Figure 9:
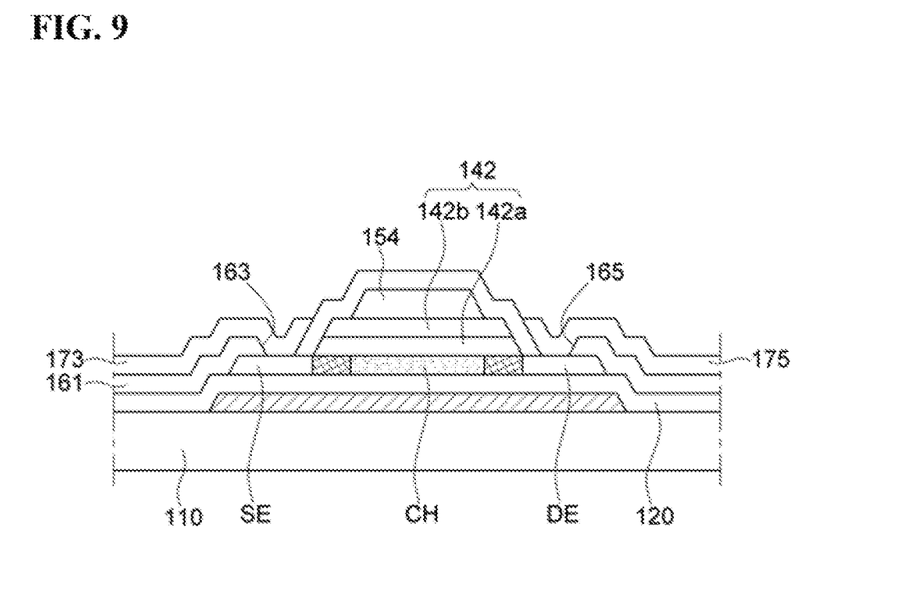
FIG. 9 is a cross-sectional view illustrating a transistor according to an exemplary embodiment of the present invention.

FIG. 9 is a cross-sectional view illustrating a transistor according to an exemplary embodiment of the present invention.

The structure of the transistor illustrated in FIG. 9 may be applied to the pixel transistor, the light sensor transistor, the gate driving transistor, and the sensing driving transistor included in an exemplary embodiment of the present invention. However, even when such a structure is applied to all of the above elements, the semiconductor layer of the light sensor transistor includes an oxide semiconductor. For example, the semiconductor layer, which includes a channel area, of the pixel transistor may include a material different from a material which the semiconductor layer of the light sensor transistor includes. In addition, the material included in the semiconductor layer of the light sensor transistor is more sensitive to light than the material included in the semiconductor layer of the pixel transistor.

The semiconductor layers of the pixel transistor, the gate driving transistor, and the sensing driving transistor, other than that of the light sensor transistor, may include a polycrystalline silicon or an oxide semiconductor.

A buffer layer 120 is disposed on a substrate 110, and may include an insulating oxide such as, for example, silicon oxide ($SiO_2$), aluminum oxide ($Al_2O_3$), hafnium oxide ($HfO_2$), or yttrium oxide ($Y_2O_3$). The buffer layer 120 substantially prevents impurities from the insulating substrate 110 from being introduced into the semiconductor to be stacked thereon, thereby protecting the semiconductor and enhancing the interface characteristics of the semiconductor.

A semiconductor CH, a source electrode SE, and a drain electrode DE are disposed on the buffer layer 120. The semiconductor CH may include an oxide semiconductor material.

An insulating layer 142 is disposed on the semiconductor CH. The insulating layer 142 may not substantially overlap the source electrode SE or the drain electrode DE.

The insulating layer 142 may be a single-layered film or a multi-layered film including more than two layers.

When the insulating layer 142 is a single-layered film, the insulating layer 142 may include an insulating oxide such as, for example, silicon oxide ($SiO_2$), aluminum oxide ($Al_2O_3$), hafnium oxide ($HfO_2$), or yttrium oxide ($Y_2O_3$). Each of these insulating oxides may allow the insulating layer 142 to be formed as a high density thin film, thereby being non-permeable or less permeable for impurities. The insulating layer 142 may enhance the interface characteristics of the semiconductor CH and substantially prevent impurities from penetrating into the semiconductor CH.

When the insulating layer 142 is a multi-layered film, the insulating layer 142 may include a lower film 142a and an upper film 142b, as illustrated in FIG. 9. The lower film 142a may include an insulating oxide such as, for example, silicon oxide ($SiO_2$), aluminum oxide ($Al_2O_3$), hafnium oxide ($HfO_2$), or yttrium oxide ($Y_2O_3$), thereby enhancing the interface characteristics of the semiconductor CH and substantially preventing impurities from penetrating into the semiconductor CH. The upper film 142b may include various insulating materials such as, for example, silicon nitride ($SiN_x$), silicon oxide ($SiO_2$), etc. For example, the insulating layer 142 may include a lower film including aluminum oxide ($Al_2O_3$) and an upper film including silicon oxide ($SiO_2$). A gate electrode 154 is disposed on the insulating layer 142.

A passivation layer 161 is disposed on the gate electrode 154, the source electrode SE, the drain electrode DE, and the buffer layer 120. The passivation layer 161 may include an inorganic insulating material such as, for example, silicon nitride ($SiN_x$) or silicon oxide ($SiO_2$), or an organic insulating material. The passivation layer 161 may include a contact hole 163 exposing the source electrode SE and a contact hole 165 exposing the drain electrode DE.

A data input electrode 173 and a data output electrode 175 may be disposed on the passivation layer 161. The data input electrode 173 may be electrically connected to the source electrode SE of a thin film transistor through the contact hole 163 of the protective layer 161. The data output electrode 175 may be electrically connected to the drain electrode DE of the thin film transistor through the contact hole 165 of the passivation layer 161.

Figure 10:
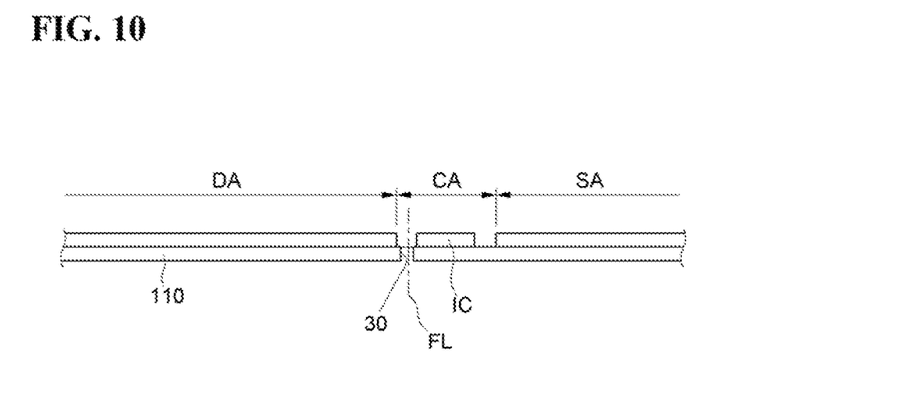
FIG. 10 is a cross-sectional view illustrating a display device according to an exemplary embodiment of the present invention in an unfolded state.

FIG. 10 is a cross-sectional view illustrating a display device according to an exemplary embodiment of the present invention in an unfolded state.

The display device of FIG. 10 includes a substrate 110 and a driving IC, similar to the above-described flexible display panel with reference to FIG. 1.

The substrate 110 includes a display portion DA, a connection portion CA extending from the display portion DA, and a light sensing portion SA extending from the connection portion CA.

The connection portion CA may be folded with respect to a folding line FL. The substrate 110 may have a groove 30 defined in a back surface of the substrate corresponding to the folding line FL so that the substrate may be easily folded.

Although a cross-section of the groove is depicted as a rectangle in the drawing, the present invention is not limited thereto. For example, the groove may be formed with various shape. In addition, the groove may be filled with an elastic body.

The display portion DA, the connection portion CA, and the light sensing portion SA of the substrate 110 are areas divided for ease of descriptions, and are actually located on one surface of the substrate 110.

As set forth hereinabove, a display device capable of substantially preventing the coupling phenomenon between the pixel unit and the sensor unit may be provided, while lowering the manufacturing costs of the display device.

While the present invention has been illustrated and described with reference to the exemplary embodiments thereof, it will be apparent to those of ordinary skill in the art that various changes in form and detail may be formed thereto without departing from the spirit and scope of the present invention as defined by the appended claims.

What is claimed is:

1. A display device comprising:
    a substrate comprising a display portion, a light sensing portion, and a connection portion located between the display portion and the light sensing portion;
    pixel transistors disposed at the display portion;
    light sensor transistors disposed at the light sensing portion;
    a driving integrated circuit disposed at the connection portion and applying a driving signal to each of the pixel transistors and the light sensor transistors; and
    an organic light emitting element disposed at the display portion,
    wherein the connection portion is bent, and by bending of the connection portion, the light sensing portion overlaps the display portion and at least one of the light sensor transistors is disposed overlapping the display portion
    the light sensor transistors comprise a light sensor driving transistor and a light sensor switching transistor,
    the organic light emitting element comprises a pixel electrode, and
    at least one of the light sensor driving transistors disposed overlapping the display portion does not overlap the pixel electrode.

2. The display device of claim 1, wherein the display portion, the connection portion, and the light sensing portion are located on one surface of the substrate.

3. The display device of claim 1, wherein the connection portion has a width smaller than a width of the display portion and a width of the light sensing portion.

4. The display device of claim 1, wherein each of the pixel transistors comprises a channel layer comprising a first material different from a second material which a channel layer of each of the light sensor transistors comprises.

5. The display device of claim 4, wherein the second material included in the channel layer of each of the light sensor transistors is more sensitive to light than the first material included in the channel layer of each of the pixel transistors.

6. The display device of claim 4, wherein
the light sensor switching transistor comprises a channel layer comprising one of an oxide semiconductor and a polycrystalline silicon, and
the light sensor driving transistor comprises a channel layer comprising an oxide semiconductor.

7. The display device of claim 1, wherein each of the pixel transistors comprises a channel layer comprising a polycrystalline silicon or an oxide semiconductor.

8. The display device of claim 1,
wherein the organic light emitting element is connected to the pixel transistors, and the pixel electrode comprises a reflective pixel electrode.

9. The display device of claim 1, wherein the pixel transistors and the light sensor transistors have a top gate structure.

10. The display device of claim 1, wherein the light sensor transistors are disposed vertically alternately with the pixel transistors.

11. The display device of claim 1, wherein the organic light emitting element further comprises a light emitting layer, and
the light emitting layer is not disposed vertically between the pixel electrode and the light sensor transistor.

12. A display device comprising:
a substrate comprising a display portion, a light sensing portion, and a connection portion located between the display portion and the light sensing portion;
pixel transistors disposed at the display portion;
light sensor transistors disposed at the light sensing portion; and
a pixel gate driver disposed at the display portion, the pixel gate driver connected to the pixel transistors through a first connection line; and
a light sensor gate driver disposed at the light sensing portion, the light sensor gate driver connected to the light sensor transistors through a second connection line; and
an organic light emitting element disposed at the display portion,
wherein the connection portion is bent and by bending of the connection portion, the light sensing portion overlaps the display portion and at least one of the light sensor transistors is disposed overlapping the display portion
the light sensor transistors comprise a light sensor driving transistor and a light sensor switching transistor,
the organic light emitting element comprises a pixel electrode, and
at least one of the light sensor driving transistors disposed overlapping the display portion does not overlap the pixel electrode.

13. The display device of claim 12, further comprising a driving integrated circuit disposed at the connection portion, wherein the driving integrated circuit applies a driving signal to each of the pixel transistors and the light sensor transistors, and
the pixel gate driver and the light sensor gate driver are connected to the driving integrated circuit.

14. The display device of claim 12, wherein the pixel gate driver comprises a pixel gate driving transistor, and
the light sensor gate driver comprises a light sensor gate driving transistor.

15. The display device of claim 14, wherein the pixel gate driving transistor and the light sensor gate driving transistor comprise a channel layer comprising a polycrystalline silicon or an oxide semiconductor.

16. The display device of claim 12, wherein each of the pixel transistors comprises a channel layer comprising a material different from a material included in a channel layer of each of the light sensor transistors.

17. The display device of claim 12, wherein
the light sensor switching transistor comprises a channel layer comprising one of an oxide semiconductor and a polycrystalline silicon, and
the light sensor driving transistor comprises a channel layer comprising an oxide semiconductor.

18. The display device of claim 12, wherein each of the pixel transistors comprises a channel layer comprising a polycrystalline silicon or an oxide semiconductor.

19. The display device of claim 12,
wherein the organic light emitting element is connected to the pixel transistors and the pixel electrode comprises a reflective pixel electrode.

20. The display device of claim 12, wherein the light sensor transistors are disposed vertically alternately with the pixel transistors.

21. The display device of claim 12, wherein the light emitting layer is not disposed vertically between the pixel electrode and the light sensor transistor.

22. A display device comprising:
a substrate comprising a display portion, a light sensing portion, and a connection portion located between the display portion and the light sensing portion;
pixel transistors disposed at the display portion;
light sensor transistors disposed at the light sensing portion;
a driving integrated circuit disposed at the connection portion and applying a driving signal to each of the pixel transistors and the light sensor transistors; and
an organic light emitting element disposed at the display portion, connected to the pixel transistors, and comprising a light emitting layer and a pixel electrode,
wherein
the light sensor transistors do not overlap the pixel electrode in a direction perpendicular to the first and second back surfaces, and
the light emitting layer is not disposed vertically between the pixel electrode and the light sensor transistor in the direction perpendicular to the first and second back surfaces.

23. The display device of claim 22, wherein a material included in a channel layer of each of the light sensor transistors is more sensitive to light than a material included in a channel layer of each of the pixel transistors.

* * * * *